(12) United States Patent
Zhao et al.

(10) Patent No.: US 11,955,948 B1
(45) Date of Patent: Apr. 9, 2024

(54) BULK ACOUSTIC WAVE RESONATOR AND BULK ACOUSTIC WAVE FILTER

(71) Applicant: Wuhan MEMSonics Technologies Co., Ltd., Wuhan (CN)

(72) Inventors: Kunli Zhao, Wuhan (CN); Yan Liu, Wuhan (CN); Tiancheng Luo, Wuhan (CN); Bowoon Soon, Singapore (SG); Chengliang Sun, Wuhan (CN)

(73) Assignee: Wuhan MEMSonics Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/089,607

(22) Filed: Dec. 28, 2022

(51) Int. Cl.
*H03H 9/135* (2006.01)
*H03H 9/17* (2006.01)
*H03H 9/54* (2006.01)

(52) U.S. Cl.
CPC .............. *H03H 9/135* (2013.01); *H03H 9/17* (2013.01); *H03H 9/54* (2013.01)

(58) Field of Classification Search
CPC ............. H03H 9/135; H03H 9/17; H03H 9/54
See application file for complete search history.

(56) References Cited

U.S. PATENT DOCUMENTS

| 6,215,375 | B1 * | 4/2001 | Larson, III | H03H 9/585 310/365 |
| 7,629,865 | B2 * | 12/2009 | Ruby | H03H 9/174 333/188 |
| 10,523,179 | B2 * | 12/2019 | Menendez-Nadal | H03H 9/173 |
| 2002/0196103 | A1 * | 12/2002 | Yang | H03H 9/173 333/189 |
| 2007/0279153 | A1 | 12/2007 | Ruby | |
| 2010/0060384 | A1 | 3/2010 | Taniguchi et al. | |

FOREIGN PATENT DOCUMENTS

CN 111654257 A 9/2020

OTHER PUBLICATIONS

Corresponding CN First Search Report dated Sep. 23, 2022.

* cited by examiner

*Primary Examiner* — Andrea Lindgren Baltzell
*Assistant Examiner* — Kimberly E Glenn
(74) *Attorney, Agent, or Firm* — Samson G. Yu

(57) ABSTRACT

This application provides a bulk acoustic wave resonator and a bulk acoustic wave filter, and relates to the technical field of filters. The bulk acoustic wave resonator includes a substrate, and a bottom electrode, a piezoelectric layer, a top electrode which are sequentially stacked on the substrate, and an outline of an orthographic projection of the top electrode on the substrate is formed by four curves which are end-to-end connected. Arc transition is set at a joint of every two adjacent curves, and every two curves arranged in a spaced manner are not parallel. Accordingly, reliability of devices can be effectively improved, meanwhile, parasitic resonance amplitude can be effectively restrained, a Q value is increased, and thus device properties are improved.

18 Claims, 5 Drawing Sheets

BULK ACOUSTIC WAVE RESONATOR AND BULK ACOUSTIC WAVE FILTER

CROSS-REFERENCE TO RELATED APPLICATION

This present disclosure claims the priority to Chinese patent application No. 202111175347.6, entitled "Bulk acoustic wave resonator and bulk acoustic wave filter", and filed on Oct. 9, 2021 in China, and the contents of which are hereby incorporated by reference in its entirety.

TECHNICAL FIELD

This application relates to the technical field of filters, in particular to a bulk acoustic wave resonator and a bulk acoustic wave filter.

BACKGROUND

A bulk acoustic wave filter utilizes a piezoelectric effect of piezoelectric crystals for generating resonance, the resonance is generated by mechanical waves instead of electromagnetic waves, and a wavelength of the mechanical waves is much shorter than that of the electromagnetic waves. Thus, sizes of the bulk acoustic wave filter and resonators forming the bulk acoustic wave filter are greatly reduced relative to a size of a conventional electromagnetic filter. On the other hand, crystal orientation growth of the piezoelectric crystals can be well controlled at present, losses of the resonators are extremely low, a quality factor is high, and thus complex design requirements such as a steep transition zone and low insertion losses can be met. The bulk acoustic wave filter has characters of being small in size, high in roll-off, low in insertion loss, etc., and thus the filter with the bulk acoustic wave filter as a core is widely applied to a communication system.

An electrode of the existing bulk acoustic wave filter is commonly in a shape with a sharp corner, the sharp corner is likely to crack when doing chemical mechanical polish, meanwhile, stress concentration is likely to be caused, and consequently device properties become invalid.

SUMMARY

This application aims to provide a bulk acoustic wave resonator and a bulk acoustic wave filter to overcome defects in the prior art and solve problems that a sharp corner of an existing bulk acoustic wave filter when doing chemical mechanical polish is likely to crack, meanwhile, stress concentration is likely to be caused, and consequently device properties become invalid.

In order to achieve the above purpose, the embodiment of this application adopts following technical schemes:

according to one aspect of the embodiment of this application, a bulk acoustic wave resonator is provided and includes a substrate, and a bottom electrode, a piezoelectric layer and a top electrode which are sequentially stacked on the substrate, an outline of an orthographic projection of the top electrode on the substrate is formed four curves, which are end-to-end connected, arc transition is set at a joint of every two adjacent curves, and every two curves arranged in a spaced manner are not parallel.

Optionally, connection points of every two adjacent curves are connected to form a quadrangle, four sides of the quadrangle are in one-to-one correspondence to the four curves, and two end points of each side are in coincidence with two end points of the corresponding curve; and each curve includes a plurality of sequentially-connected sub-curves, an end point of one of every two adjacent sub-curves is connected to a starting point of the other one of every two adjacent sub-curves, and distances between the starting points of all the sub-curves and the corresponding sides of the starting points are different.

Optionally, included angles between tangent lines of the starting points of all the sub-curves and the corresponding sides are different.

Optionally, an included angle between a tangent line of the starting point of each sub-curve and the corresponding side is less than 45 degrees.

Optionally, each curve includes a first sub-curve, a second sub-curve and a third sub-curve which are sequentially connected and the first sub-curve and the second sub-curve, the first sub-curve and the third sub-curve, the second sub-curve and the third sub-curve are different in length.

Optionally, a length of each first sub-curve is greater than that of the third sub-curve, and a length of each third sub-curve is greater than that of the second sub-curve.

Optionally, a difference value between the length of each first sub-curve and the length of the third sub-curve ranges from 5 microns to 20 microns, and a difference value between the length of each third sub-curve and the length of the second sub-curve ranges from 5 microns to 20 microns.

Optionally, an included angle between a tangent line of a starting point of each first sub-curve and a corresponding side of the starting point of each first sub-curve is 37 degrees, an included angle between a tangent line of a starting point of each second sub-curve and a corresponding side of the starting point of each second sub-curve is 42 degrees, and an included angle between a tangent line of a starting point of each third sub-curve and a corresponding side of the starting point of each third sub-curve is 40 degrees.

Optionally, the top electrode and the bottom electrode are same in shape, and the piezoelectric layer and the top electrode are same in shape.

According to the other aspect of the embodiment of this application, a bulk acoustic wave filter is provided and includes a plurality of any above bulk acoustic wave resonators, where every two adjacent bulk acoustic wave resonators are connected in series or in parallel.

This application has the following beneficial effects:
this application provides the bulk acoustic wave resonator and the bulk acoustic wave filter; and the bulk acoustic wave resonator includes the substrate, and the bottom electrode, the piezoelectric layer and the top electrode which are sequentially stacked on the substrate, and the outline of the orthographic projection of the top electrode on the substrate is formed by end-to-end connection of the four curves, arc transition is set at the joint of every two adjacent curves, and every two curves arranged in the spaced manner are not parallel. Accordingly, reliability of devices can be effectively improved, meanwhile, parasitic resonance amplitude can be effectively restrained, a Q value is increased, and thus device properties are improved.

BRIEF DESCRIPTION OF THE DRAWINGS

In order to describe technical schemes in the embodiments of this application more clearly, drawings required to be used in the embodiments will be simply introduced below, it is to be understood that the following drawings only show some embodiments of this application, which cannot be regarded as limitations on a scope, and those ordinarily skilled in the art can further obtain other related drawings according to the drawings without creative work.

Figure 1:
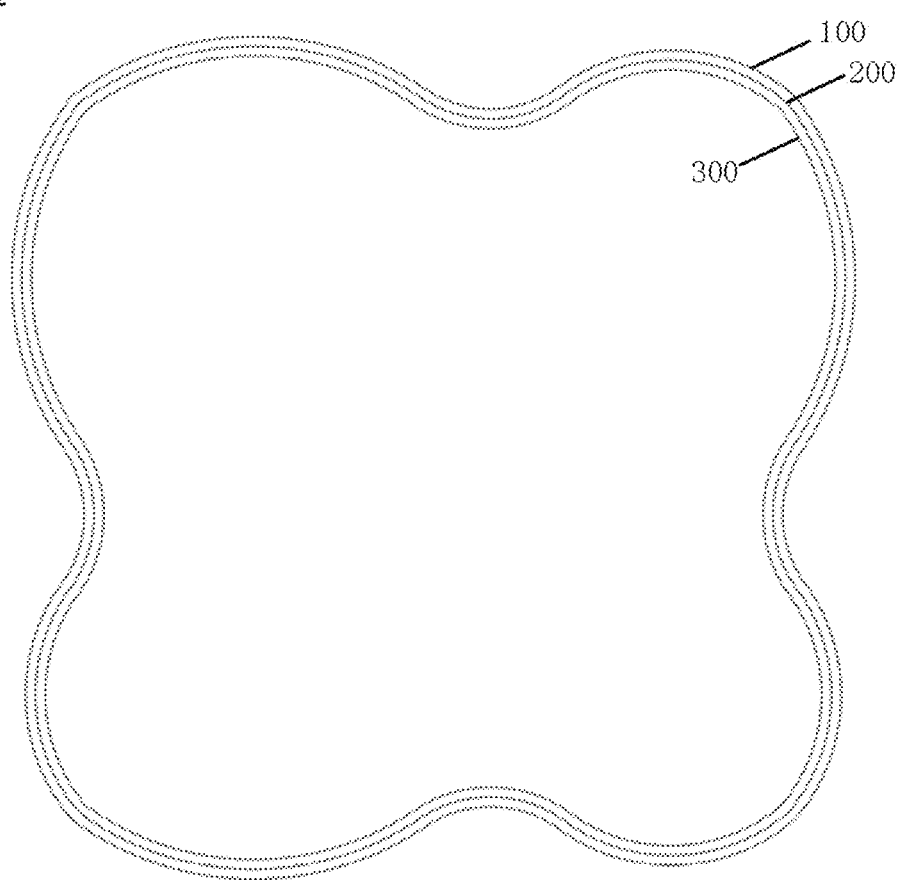
FIG. 1 is one of structural schematic diagrams of a bulk acoustic wave resonator provided by an embodiment of this application.

Drawing marks: 100—bottom electrode; 200—piezoelectric layer; 300—top electrode; 310—first curve; 311—first sub-curve; 312—second sub-curve; 313—third sub-curve; 320—second curve; 321—fourth sub-curve; 322—fifth sub-curve; 323—sixth sub-curve; 330—third curve; 331—seventh sub-curve; 332—eighth sub-curve; 333—ninth sub-curve; 340—fourth curve; 341—tenth sub-curve; 342—eleventh sub-curve; 343—twelfth sub-curve; 351—first side; 352—second side; 353—third side; 354—fourth side; 400—substrate; 410—signal end; and 500—bulk acoustic wave resonator.

DETAILED DESCRIPTION OF THE EMBODIMENTS

To make purposes, technical schemes and advantages of embodiments of this application more clear, the technical schemes in the embodiments of this application are clearly and integrally described in combination with drawings in the embodiments of this application as below, and it is apparent that the described embodiments are only a part rather all of embodiments. Assemblies, described and shown in the drawings herein, in the embodiments of this application may be generally arranged and designed according to different configurations It is to be understood that terms such as "first" and "second" may be used for describing various elements in this application but cannot limit the elements. The terms are only used for distinguishing one element from another element. For instance, a first element may be called as a second element without departing from a scope of the present disclosure, and similarly, the second element may be called as the first element. A term "and/or" used in this application includes any one or more and all combinations of associated listed items It is to be understood that when one element (e.g., a layer, an area or a substrate) is "arranged on another element" or "extends to another element", the element may be directly arranged on another element or directly extend to another element, or a middle element may exist. On the contrary, when one element is "directly arranged on another element" or "directly extends to another element", a middle element does not exist. Similarly, it is to be understood that when one element (e.g., a layer, an area or substrate) is "arranged above another element" or "extends above another element", the element may be directly arranged above another element or directly extend above another element, or a middle element may exist. On the contrary, when one element is "directly arranged above another element" or "directly extends above another element", a middle element does not exist. It is to be understood that when one element is "connected" or "coupled" to another element, the element may be directly connected or coupled to another element, or a middle element may exist. On the contrary, when one element is "directly connected" or "directly coupled" to another element, a middle element does not exist.

Except additional definition, all terms (including technological and scientific terms) used in this application have the same meaning usually understood by those ordinarily skilled in the art of the present disclosure. It is to be understood that the terms used in this application are explained to be consistent to those in Description and related fields in meaning instead of being explained with ideal or too formal meaning, except clear definition in this application.

According to one aspect of the embodiment of this application, a bulk acoustic wave resonator is provided, and as shown in FIG. 1, includes a substrate 400 (not shown in FIG. 1), and a bottom electrode 100, a piezoelectric layer 200 and a top electrode 300 are sequentially arranged on the substrate 400, where, the bottom electrode 100 is arranged on the substrate 400, the piezoelectric layer 200 is stacked on the bottom electrode 100, the top electrode 300 is stacked on the piezoelectric layer 200, and accordingly, the bottom electrode 100, the piezoelectric layer 200 and the top electrode 300 which are arranged in a stacked manner are formed. In some implementation modes, the substrate 400 may be base materials for bearing semiconductor integrated circuit components and parts, such as a Si substrate, a SiO2 substrate, a SiC substrate and a sapphire substrate.

Figure 2:
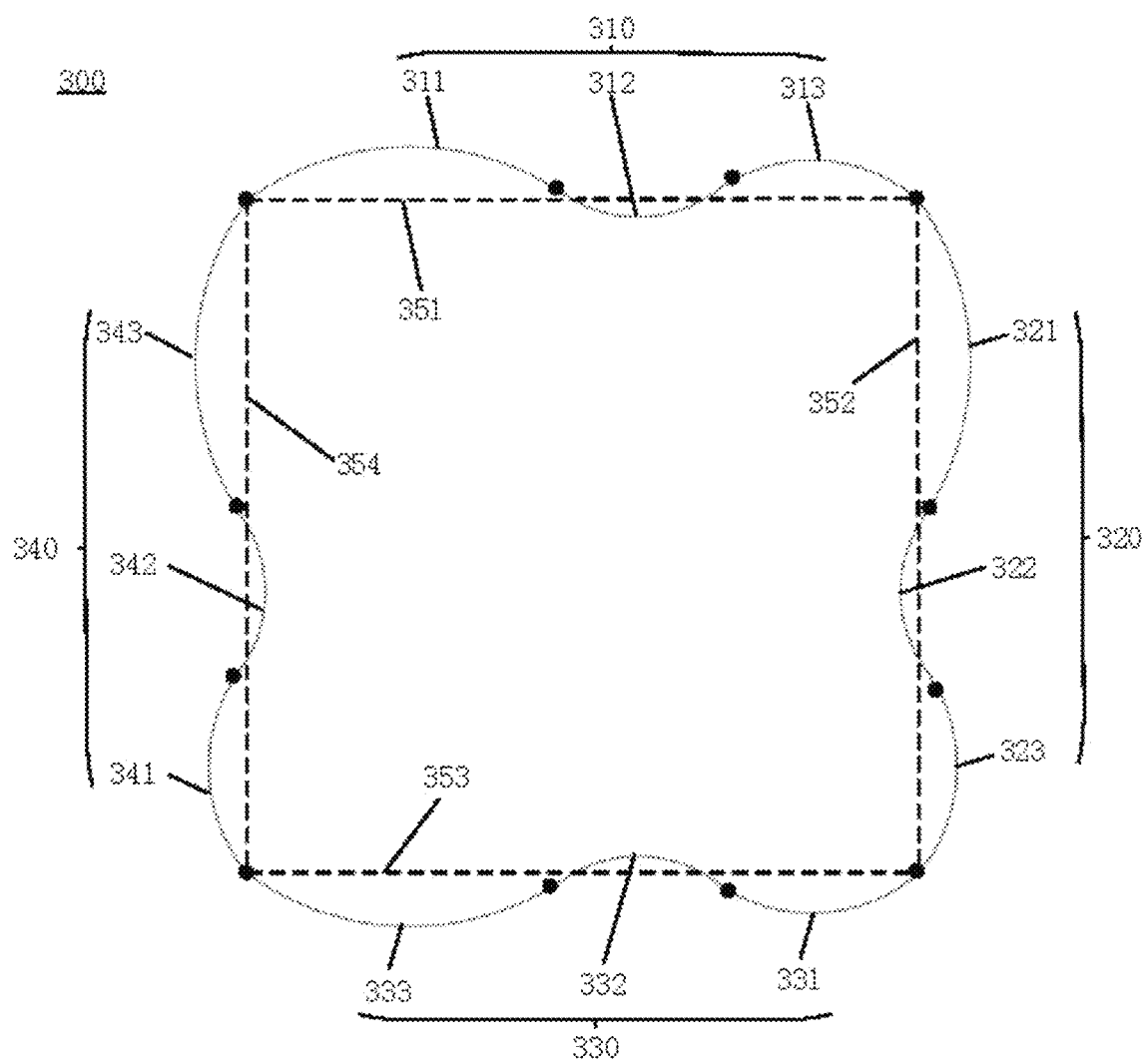
FIG. 2 is a schematic diagram of an outline of a top electrode provided by the embodiment of this application.

As shown in FIG. 2, an outline of an orthographic projection of the top electrode 300 on the substrate 400 is a closed shape formed by end-to-end connection of a first curve 310, a second curve 320, a third curve 330 and a fourth curve 340. Arc transition is set at a joint of every two adjacent curves, accordingly, an edge of the top electrode 300 is in smooth transition, and an edge of the top electrode 300 can be prevented from having a sharp corner, thereby effectively preventing a phenomenon of device property failures due to cracking of the top electrode 300 in Chemical Mechanical Polish (CMP), and accordingly improving reliability and yield of devices.

As shown in FIG. 2, the first curve 310 and the third curve 330 are arranged in a spaced manner, the second curve 320 and the fourth curve 340 are arranged in a spaced manner, the first curve 310 is not parallel to the third curve 330, the second curve 320 is not parallel to the fourth curve 340, and accordingly, a transverse propagation path of acoustic waves is irregular, thereby effectively restraining parasitic resonance amplitude, increasing a Q value of the bulk acoustic wave resonator 500 of this application, and accordingly improving device properties.

Optionally, as shown in FIG. 2, the first curve 310, the second curve 320, the third curve 330 and the fourth curve 340 are connected in an end-to-end manner so as to form four connection points, and the four connection points are sequentially connected to form a quadrangle. It is to be understood that the quadrangle is merely used for auxiliary reference and does not exist in the bulk acoustic wave resonator 500 actually. To facilitate describing and distinguishing, four sides of the quadrangle are sequentially named as a first side 351, a second side 352, a third side 353 and a fourth side 354.

The four sides of the quadrangle are in one-to-one correspondence to the four curves. A corresponding relation is that two end points of each side are in coincidence with two end points of the corresponding curve. As shown in FIG. 2, the first curve 310 corresponds to the first side 351, the second curve 320 corresponds to the second side 352, the third curve 330 corresponds to the third side 353, and the fourth curve 340 corresponds to the fourth side 354.

Each curve includes a plurality of sub-curves sequentially connected. An end point of one of every two adjacent sub-curves is connected to a starting point of the other one of every two adjacent sub-curves. In some implementation modes, each curve includes three sub-curves (of course, in other implementation modes, each curve may further include two sub-curves or four sub-curves, etc., and setting forms of each curve may refer to this implementation mode). For example:

As shown in FIG. 2, the first curve 310 includes a first sub-curve 311, a second sub-curve 312 and a third sub-curve 313, where an end point of the first sub-curve 311 is in coincidence with a starting point of the second sub-curve 312, and an end point of the second sub-curve 312 is in coincidence with a starting point of the third sub-curve 313.

The second curve 320 includes a fourth sub-curve 321 (the first sub-curve 311 of the second curve 320), a fifth sub-curve 322 (the second sub-curve 312 of the second curve 320) and a sixth sub-curve 323 (the third sub-curve 313 of the second curve 320), where, an end point of the fourth sub-curve 321 is in coincidence with a starting point of the fifth sub-curve 322, and an end point of the fifth sub-curve 322 is in coincidence with a starting point of the sixth sub-curve 323.

The third curve 330 includes a seventh sub-curve 331 (the first sub-curve 311 of the third curve 330), an eighth sub-curve 332 (the second sub-curve 312 of the third curve 330) and a ninth sub-curve 333 (the third sub-curve 313 of the third curve 330), where an end point of the seventh sub-curve 331 is in coincidence with a starting point of the eighth sub-curve 332, and an end point of the eighth sub-curve 332 is in coincidence with a starting point of the ninth sub-curve 333.

The fourth curve 340 includes a tenth sub-curve 341 (the first sub-curve 311 of the fourth curve 340), an eleventh sub-curve 342 (the second sub-curve 312 of the fourth curve 340) and a twelfth sub-curve 343 (the third sub-curve 313 of the fourth curve 340), where an end point of the tenth sub-curve 341 is in coincidence with a starting point of the eleventh sub-curve 342, and an end point of the eleventh sub-curve 342 is in coincidence with a starting point of the twelfth sub-curve 343.

As shown in FIG. 2, an end point of the third sub-curve 313 is in coincidence with a starting point of the fourth sub-curve 321, an end point of the sixth sub-curve 323 is in coincidence with a starting point of the seventh sub-curve 331, an end point of the ninth sub-curve 333 is in coincidence with a starting point of the tenth sub-curve 341, and an end point of the twelfth sub-curve 343 is in coincidence with a starting point of the first sub-curve 311, thereby forming a closed shape.

Figure 3:
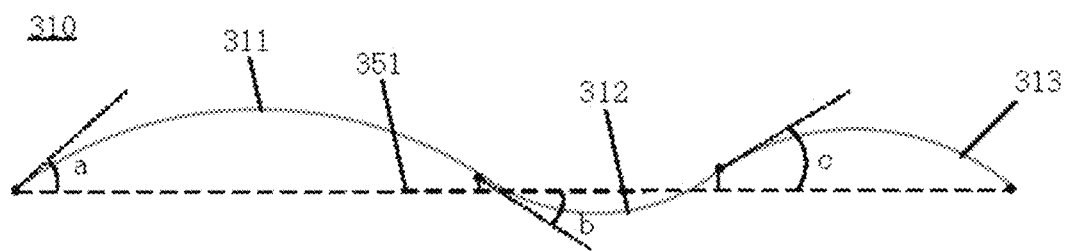
FIG. 3 is a second curve schematic diagram of the outline of the top electrode provided by the embodiment of this application.

Taking the first curve 310 as an example, as shown in FIG. 3, a distance between the starting point of the first sub-curve 311 and the first side 351, a distance between the starting point of the second sub-curve 312 and the first side 351, and a distance between the starting point of the third sub-curve 313 and the first side 351 are different. The distance between the starting point of the first sub-curve 311 and the first side 351 is zero, the distance between the starting point of the second sub-curve 312 and the first side 351 is greater than zero, and the distance between the starting point of the third sub-curve 313 and the first side 351 is greater than the distance between the starting point of the second sub-curve 312 and the first side 351.

Taking the second curve 320 as an example, as shown in FIG. 2, a distance between the starting point of the fourth sub-curve 321 and the second side 352, a distance between the starting point of the fifth sub-curve 322 and the second side 352, and a distance between the starting point of the sixth sub-curve 323 and the second side 352 are different. The distance between the starting point of the fourth sub-curve 321 and the second side 352 is zero, the distance between the starting point of the fifth sub-curve 322 and the second side 352 is greater than zero, and the distance between the starting point of the sixth sub-curve 323 and the second side 352 is greater than the distance between the starting point of the second sub-curve 322 and the second side 352.

In a similar way, settings of the third curve 330 and the fourth curve 340 refer to the above settings, thereby further disordering the transverse propagation path of the acoustic waves, restraining the parasitic resonance amplitude, increasing the Q value of the bulk acoustic wave resonator 500 and accordingly improving device properties.

Optionally, as shown in FIG. 2, included angles between tangent lines of the starting points of all the sub-curves and the corresponding sides are different, thereby weakening parasitic resonance and effectively improving device properties. Taking the first curve 310 as an example, as shown in FIG. 3, the included angle between the tangent line of the starting point of the first sub-curve 311 and the first side 351 is an included angle a, the included angle between the tangent line of the starting point of the second sub-curve 312 and the first side 351 is an included angle b, the included angle between the tangent line of the starting point of the third sub-curve 313 and the first side 351 is an included angle c, and the included angle a, the included angle b and the included angle are different.

Taking the second curve 320 as an example, as shown in FIG. 2, the included angle between the tangent line at the starting point of the fourth sub-curve 321 and the second side 352, the included angle between the tangent line at the starting point of the fifth sub-curve 322 and the second side 352 and the included angle between the tangent line at the starting point of the sixth sub-curve 323 and the second side 352 are different.

In a similar way, settings of the third curve 330 and the fourth curve 340 refer to the above settings, thereby further disordering the transverse propagation path of the acoustic waves, restraining the parasitic resonance amplitude, increasing the Q value of the bulk acoustic wave resonator 500 and accordingly improving device properties.

Optionally, as shown in FIG. 2, the included angle between the tangent line of the starting point of each sub-curve and the corresponding side is less than 45 degrees, accordingly, an outline of the top electrode 300 may be smoother, and a phenomenon of unable membrane thickening due to edge corner crack and stress concentration is further reduced.

Taking the first curve 310 as an example, as shown in FIG. 3, the included angle between the tangent line of the starting point of the first sub-curve 311 and the first side 351 is 37 degrees, the included angle between the tangent line of the starting point of the second sub-curve 312 and the corresponding side is 42 degrees, and the included angle between the tangent line of the starting point of the third sub-curve 313 and the corresponding side is 40 degrees.

Taking the second curve 320 as an example, as shown in FIG. 2, the included angle between the tangent line of the starting point of the fourth sub-curve 321 and the second side 352 is 37 degrees, the included angle between the tangent line of the starting point of the fifth sub-curve 322 and the second side 352 is 42 degrees, and the included angle between the tangent line of the starting point of the sixth sub-curve 323 and the second side 352 is 40 degrees.

In a similar way, settings of the third curve 330 and the fourth curve 340 refer to the above settings, thereby further disordering the transverse propagation path of the acoustic waves, restraining the parasitic resonance amplitude, increasing the Q value of the bulk acoustic wave resonator 500 and accordingly improving device properties.

Optionally, as shown in FIG. 2, each curve includes the first sub-curve 311, the second sub-curve 312 and the third sub-curve 313 which are sequentially connected, where the first sub-curve 311, the second sub-curve 312 and the third sub-curve 313 are different in length, accordingly, conditions for forming standing waves can be damaged, parasitic resonance is weakened, and device properties can be effectively improved. It needs to be explained that a length of each curve is a length of the straightened curve.

Taking the first curve 310 as an example, as shown in FIG. 3, a length of the first sub-curve 311 is greater than that of the third sub-curve 313, and the length of the third sub-curve 313 is greater than that of the second sub-curve 312.

Taking the second curve 320 as an example, as shown in FIG. 2, a length of the fourth sub-curve 321 is greater than that of the sixth sub-curve 323, and the length of the sixth sub-curve 323 is greater than that of the fifth sub-curve 322.

In a similar way, settings of the third curve 330 and the fourth curve 340 refer to the above settings, thereby further disordering the transverse propagation path of the acoustic waves, restraining the parasitic resonance amplitude, increasing the Q value of the bulk acoustic wave resonator 500 and accordingly improving device properties.

In some implementation modes, a difference value between the length of the first sub-curve and the length of the third sub-curve ranges from 5 microns to 20 microns, and a difference value between the length of the third sub-curve and the length of the second sub-curve ranges from 5 microns to 20 microns. Accordingly, it is avoided that parasitic resonance is not ideal due to similar curve forms when the difference value is less than 5 microns; and when the difference value is greater than 20 microns, a section of curve will be small, which will cause parasitic resonance to be centralized at one position and is not beneficial to properties of the bulk acoustic wave resonator.

In some implementation modes, as shown in FIG. 1, outlines of orthographic projections of the top electrode 300, the piezoelectric layer 200 and the bottom electrode 100 on the substrate 400 may be a first outline (the outline of the top electrode 300), a second outline (the outline of the piezoelectric layer 200) and a third outline (the outline of the bottom electrode 100), and every two of the first outline, the second outline and the third outline may be the same. In some implementation modes, the shape of the first outline may be different from the shape of the second outline. In some implementation modes, the shape of the first outline may be different from the shape of the third outline.

In some implementation modes, areas of the first outline, the second outline and the third outline may be sequentially increased, meanwhile, the first outline is located in the second outline, the second outline is located in the third outline, namely, the second outline is expanded by a certain size relative to the first outline, and the third outline is expanded by a certain size relative to the second outline.

Figure 4:
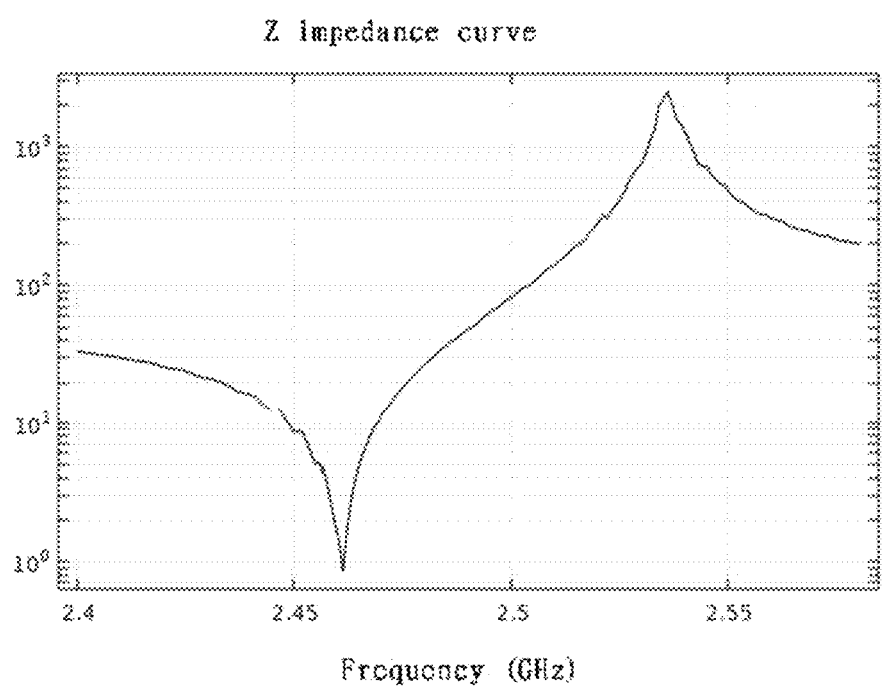
FIG. 4 is an impedance curve schematic diagram of the bulk acoustic wave resonator provided by the embodiment of this application.
Figure 5:
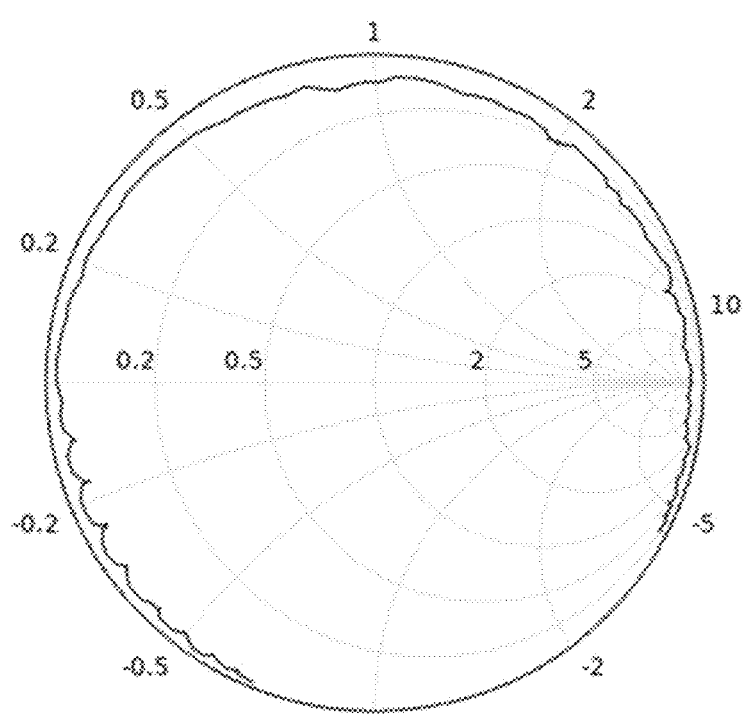
FIG. 5 is a simulation curve schematic diagram of the bulk acoustic wave resonator provided by the embodiment of this application.

In some implementation modes, when the distances between the starting points of the sub-curves and the corresponding sides are different, the length of the first sub-curve 311 of each curve is greater than that of the third sub-curve 313, the length of the third sub-curve 313 is greater than that of the second sub-curve 312, the included angle between the starting point of each sub-curve and the corresponding side is less than 45 degrees, the shape of the top electrode 300 is the same with the shape of the bottom electrode 100, and the shape of the piezoelectric layer 200 is the same with the shape of the top electrode 300, simulation schematic diagrams shown in FIG. 4 and FIG. 5 can be obtained through simulation; and it can be seen according to FIG. 4 and FIG. 5 that stray capacitance of the embodiment is less, and thus, parasitic resonance amplitude can be effectively restrained, and the Q value of the bulk acoustic wave resonator 500 is increased.

In some implementation modes, the top electrode 300 or the bottom electrode 100 may be made from one or combinations of more of molybdenum, platinum, gold, silver, aluminum, tungsten, titanium, ruthenium, copper and chromium.

Figure 6:
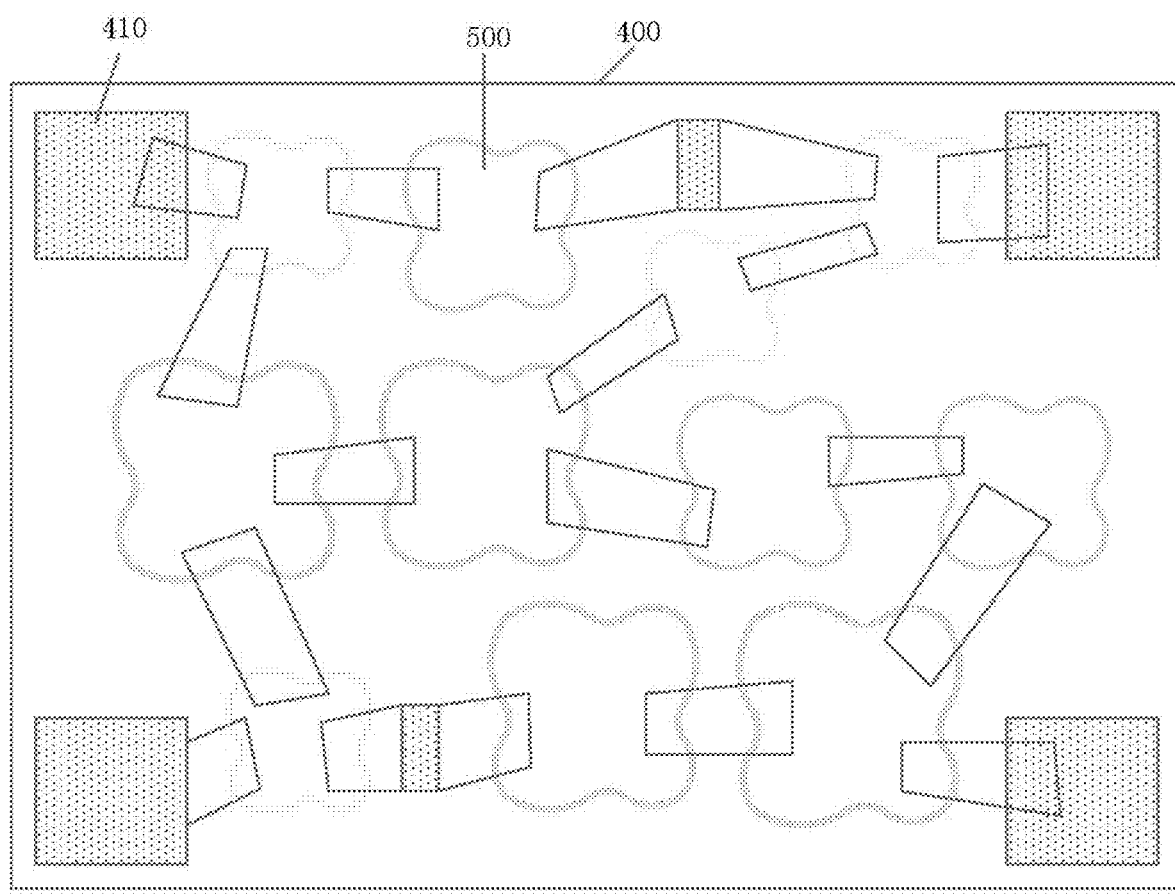
FIG. 6 is a structural schematic diagram of a bulk acoustic wave filter provided by the embodiment of this application.

According to the other aspect of the embodiment of this application, a bulk acoustic wave filter is provided and, as shown in FIG. 6, includes a plurality of bulk acoustic wave resonators 500 arranged on a substrate 400 at intervals. The plurality of bulk acoustic wave resonators 500 are connected in series or in parallel, namely, every two adjacent bulk acoustic wave resonators 500 are connected in series or in parallel, a formed series circuit and a formed parallel circuit are respectively connected to signal ends 410 on the substrate 400, and accordingly, a multi-step-shaped filter can be formed.

The above embodiments are merely preferred embodiments of this application and not used for limiting this application, and this application can be variously modified and changed for those skilled in the art. Any modification, equivalent replacement, improvement, etc. made within the spirit and the principle of this application shall fall within the scope of protection of this application.

What is claimed is:

1. A bulk acoustic wave resonator, comprising a substrate, and a bottom electrode, a piezoelectric layer and a top electrode which are sequentially stacked on the substrate, wherein an outline of an orthographic projection of the top electrode on the substrate is formed by four curves, which are end-to-end connected, arc transition is set at a joint of every two adjacent curves, and every two curves arranged in a spaced manner are not parallel, wherein connection points of every two adjacent curves are connected to form a quadrangle, four sides of the quadrangle are in one-to-one correspondence to the four curves, each curve comprises a plurality of sequentially-connected sub-curves, and distances between starting points of all the sub-curves and the corresponding sides of the starting points are different.

2. The bulk acoustic wave resonator according to claim 1, wherein included angles between tangent lines of the starting points of all the sub-curves and the corresponding sides are different.

3. The bulk acoustic wave resonator according to claim 2, wherein each curve comprises a first sub-curve, a second sub-curve and a third sub-curve which are sequentially connected, and the first sub-curve and the second sub-curve, the first sub-curve and the third sub-curve, the second sub-curve and the third sub-curve are different in length.

4. The bulk acoustic wave resonator according to claim 3, wherein a length of each first sub-curve is greater than that of the third sub-curve, and a length of each third sub-curve is greater than that of the second sub-curve.

5. The bulk acoustic wave resonator according to claim 4, wherein a difference value between the length of each first sub-curve and the length of the third sub-curve ranges from 5 microns to 20 microns, and a difference value between the length of each third sub-curve and the length of the second sub-curve ranges from 5 microns to 20 microns.

6. The bulk acoustic wave resonator according to claim 3, wherein an included angle between a tangent line of a starting point of each first sub-curve and a corresponding side of the starting point of each first sub-curve is 37 degrees, an included angle between a tangent line of a starting point of each second sub-curve and a corresponding side of the starting point of each second sub-curve is 42 degrees, and an included angle between a tangent line of a starting point of each third sub-curve and a corresponding side of the starting point of each third sub-curve is 40 degrees.

7. The bulk acoustic wave resonator according to claim 1, wherein an included angle between a tangent line of a starting point of each sub-curve and the corresponding side is less than 45 degrees.

8. The bulk acoustic wave resonator according to claim 7, wherein each curve comprises a first sub-curve, a second sub-curve and a third sub-curve which are sequentially connected, and the first sub-curve and the second sub-curve, the first sub-curve and the third sub-curve, the second sub-curve and the third sub-curve are different in length.

9. The bulk acoustic wave resonator according to claim 8, wherein a length of each first sub-curve is greater than that of the third sub-curve, and a length of each third sub-curve is greater than that of the second sub-curve.

10. The bulk acoustic wave resonator according to claim 9, wherein a difference value between the length of each first sub-curve and the length of the third sub-curve ranges from 5 microns to 20 microns, and a difference value between the length of each third sub-curve and the length of the second sub-curve ranges from 5 microns to 20 microns.

11. The bulk acoustic wave resonator according to claim 8, wherein an included angle between a tangent line of a starting point of each first sub-curve and a corresponding side of the starting point of each first sub-curve is 37 degrees, an included angle between a tangent line of a starting point of each second sub-curve and a corresponding side of the starting point of each second sub-curve is 42 degrees, and an included angle between a tangent line of a starting point of each third sub-curve and a corresponding side of the starting point of each third sub-curve is 40 degrees.

12. The bulk acoustic wave resonator according to claim 1, wherein each curve comprises a first sub-curve, a second sub-curve and a third sub-curve which are sequentially connected, and the first sub-curve and the second sub-curve, the first sub-curve and the third sub-curve, the second sub-curve and the third sub-curve are different in length.

13. The bulk acoustic wave resonator according to claim 12, wherein a length of each first sub-curve is greater than that of the third sub-curve, and a length of each third sub-curve is greater than that of the second sub-curve.

14. The bulk acoustic wave resonator according to claim 13, wherein a difference value between the length of each first sub-curve and the length of the third sub-curve ranges from 5 microns to 20 microns, and a difference value between the length of each third sub-curve and the length of the second sub-curve ranges from 5 microns to 20 microns.

15. The bulk acoustic wave resonator according to claim 12, wherein an included angle between a tangent line of a starting point of each first sub-curve and a corresponding side of the starting point of each first sub-curve is 37 degrees, an included angle between a tangent line of a starting point of each second sub-curve and a corresponding side of the starting point of each second sub-curve is 42 degrees, and an included angle between a tangent line of a starting point of each third sub-curve and a corresponding side of the starting point of each third sub-curve is 40 degrees.

16. A bulk acoustic wave filter, comprising a plurality of bulk acoustic wave resonators according to claim 12, wherein every two adjacent bulk acoustic wave resonators are connected in series or in parallel.

17. The bulk acoustic wave resonator according to claim 1, wherein the top electrode and the bottom electrode are same in shape, and the piezoelectric layer and the top electrode are same in shape.

18. A bulk acoustic wave filter, comprising a plurality of bulk acoustic wave resonators according to claim 1, wherein every two adjacent bulk acoustic wave resonators are connected in series or in parallel.

* * * * *